United States Patent [19]

Kudo et al.

[11] Patent Number: 5,475,245

[45] Date of Patent: Dec. 12, 1995

[54] FIELD-EFFECT VOLTAGE REGULATOR DIODE

[75] Inventors: Koichi Kudo; Hiroshi Kadonishi, both of Kyoto, Japan

[73] Assignee: Rohm Co., Ltd., Kyoto, Japan

[21] Appl. No.: 295,870

[22] PCT Filed: Mar. 23, 1993

[86] PCT No.: PCT/JP93/00337

§ 371 Date: Sep. 6, 1994

§ 102(e) Date: Sep. 6, 1994

[87] PCT Pub. No.: WO93/19490

PCT Pub. Date: Sep. 30, 1993

[30] Foreign Application Priority Data

Mar. 23, 1992 [JP] Japan ..................... 4-096975

[51] Int. Cl.⁶ .................. H01L 29/78; H01L 27/04
[52] U.S. Cl. .................. 257/288; 257/481; 257/551; 257/603
[58] Field of Search .................. 257/288, 481, 257/551, 603, 605, 606

[56] References Cited

FOREIGN PATENT DOCUMENTS

| 53-80 | 1/1978 | Japan | 257/605 |
| 58-111369 | 7/1983 | Japan | 257/605 |
| 61-55974 | 3/1986 | Japan | 257/605 |
| 63-38266 | 2/1988 | Japan | 257/603 |
| 3-225875 | 10/1991 | Japan | 257/605 |

*Primary Examiner*—William Mintel
*Assistant Examiner*—Minhloan Tran
*Attorney, Agent, or Firm*—William H. Eilberg

[57] ABSTRACT

A voltage regulator diode according to the present invention comprises: a semiconductor substrate (W); a highly doped source region (3) formed in the substrate (W) to adjoin one surface thereof; a highly doped drain region (D) formed in tile substrate (W) to adjoin the above-mentioned surface; a source electrode (4) held in contact with the source region (3); a shorting electrode (9) held in contact with the drain region (D); a gate insulating portion (8a) formed between the source region (3) and the drain region (4) to partly cover the above-mentioned surface of the substrate (W); and a gate electrode (10) formed to cover the gate insulating portion (8a). The gate electrode (19) is shorted to the drain region (D) through the shorting electrode (9). As a result, a channel (12) is formed in the substrate (W) to establish conduction between the source region (3) and the drain region (4) when a gate voltage not less than a predetermined threshold value is applied.

5 Claims, 3 Drawing Sheets

FIELD-EFFECT VOLTAGE REGULATOR DIODE

FIELD OF THE INVENTION

The present invention generally relates to a voltage regulator diode, and more specifically to a field-effect voltage regulator diode usable in place of a conventional Zener diode.

BACKGROUND ART

It is well known that a voltage regulator diode referred to as a Zener diode is usable for generating a standard voltage or for voltage stabilization. The Zener diode utilizes the property of a pn junction which, when subjected to an inverse voltage of no less than a predetermined value, undergoes Zener breakdown (generally below 5 V) or avalanche breakdown (generally not less than 5 V) to drastically decrease in its internal resistance, so that voltage fluctuates only little with increasing current.

A typical prior art Zener diode has such a structure as shown in FIG. 4 of the accompanying drawings. The Zener diode designated by reference numeral 100 in FIG. 4 comprises a substrate which includes a highly doped N-type impurity diffusion layer 101 (N+ layer), and an N-type impurity diffusion layer 102 epitaxially formed on the N+ layer 101. A P-type impurity diffusion region 103 is annularly formed in a surface portion of the N-type layer 102 of the substrate, and a highly doped P-type region 104 (P+ region) is formed at the center of the annular P-type region 103. The surface of the substrate is covered by an insulating layer made of silicon dioxide, and at a portion of the insulating layer corresponding to the the P+ region is formed an opening where an aluminum electrode 105 is formed. The insulating layer 106 is covered by a passivation film 107.

With the above-described structure, when a voltage Vz (breakdown voltage) beyond a predetermined value is applied between the N+ layer 101 (actually an unillustrated electrode held in contact with the N+ layer 101) and the aluminum electrode 105, a breakdown takes place at the pn junction to abruptly allow current passage. The voltage Vz in this condition fluctuates only little with increasing current and is therefore usable for voltage stabilization and etc.

However, the prior art Zener diode having the above structure still has the following problems.

First, with the prior art Zener diode, since the width of the depletion layer varies depending on the dopant concentrations on both sides of the pn junction, it is necessary to adjust the rated breakdown voltage Vz by adjusting the respective dopant concentrations in the N-type layer 102 and the P+ region 104 in the course of the manufacturing process. However, since the dopant concentration in the P+ region 104 is extremely high (not less than about $10^{20}/cm^3$), an attempt to accurately adjust the concentration by implanting a counted number of dopants will result in an extreme cost increase. Thus, it is extremely difficult to accurately adjust the rated breakdown voltage Vz in the course of the manufacturing process.

Secondly, the rated breakdown voltage Vz of the prior art Zener diode is to be set at a low value of about 2–3 V, the P+ region 104 must be made to have a super high dopant concentration of about $10^{21}/cm^3$. Such a super high concentration is likely to cause defects in the crystalline substrate, consequently leading a problem of a large leak current in addition to difficulty of concentration adjustment.

In the third place, with the prior art Zener diode, the N-type layer 102 having a relatively low dopant concentration is interposed between the N+ layer 101 and the P+ region 104, and a current flows in the N-type layer 102 when the rated breakdown voltage Vz is applied. Though the internal resistance decreases abruptly upon breakdown of the pn junction, the N-type layer 102 having a relatively low dopant density still exhibits a non-negligible resistance. Therefore, the intended voltage retention cannot be sharply realized due to the resistance of the N-type layer 102 which causes a voltage increase attendant with a current increase.

DISCLOSURE OF THE INVENTION

It is, therefore, an object of the present invention to provide a voltage regulator diode whose rated voltage can be easily controlled in the course of the manufacturing process.

Another object of the present invention to provide a voltage regulator diode which is capable of restraining a leak current even if its rated voltage is set low.

A further object of the present invention to provide a voltage regulator diode which provides improved voltage-current characteristics in comparison with a conventional Zener diode.

To achieve the above objects, the present invention provides a voltage regulator diode comprising: a semiconductor substrate; a highly doped source region formed in the substrate to adjoin one surface thereof; a highly doped drain region formed in the substrate to adjoin said one surface; a source electrode held in contact with the source region; a shorting electrode held in contact with the drain region; a gate insulating portion formed between the source region and the drain region to partly cover said one surface of the substrate; and a gate electrode formed to cover the gate insulating portion; wherein the gate electrode is shorted to the drain region through the shorting electrode, whereby a channel is formed in the substrate to establish conduction between the source region and the drain region when a gate voltage not less than a predetermined threshold value is applied.

The operation and advantages of the voltage regulator diode having the above-described structure will be specifically described later in detail on the basis of embodiments.

According to a preferred embodiment of the present invention, the substrate comprises a highly doped first layer, and a second layer formed on the first layer and having the type opposite to the first layer. The source region and the drain region are of the same type as the first layer and formed in the second layer, and the drain region extends to the first layer through the second layer. In this case, the drain region may advantageously comprise a shallower first drain portion, and a deeper second drain portion extending to the first layer through the first drain portion.

According to another preferred embodiment of the present invention, the substrate comprises a single layer, and the source region and the drain region are of the type opposite to the single layer and formed therein. In this case, the shorting electrode functions also as a drain electrode.

Various features and advantages of the present invention will become apparent from the following description of embodiments given with reference to the accompanying drawings.

BEST MODE FOR CARRYING OUT THE INVENTION

Figure 1:
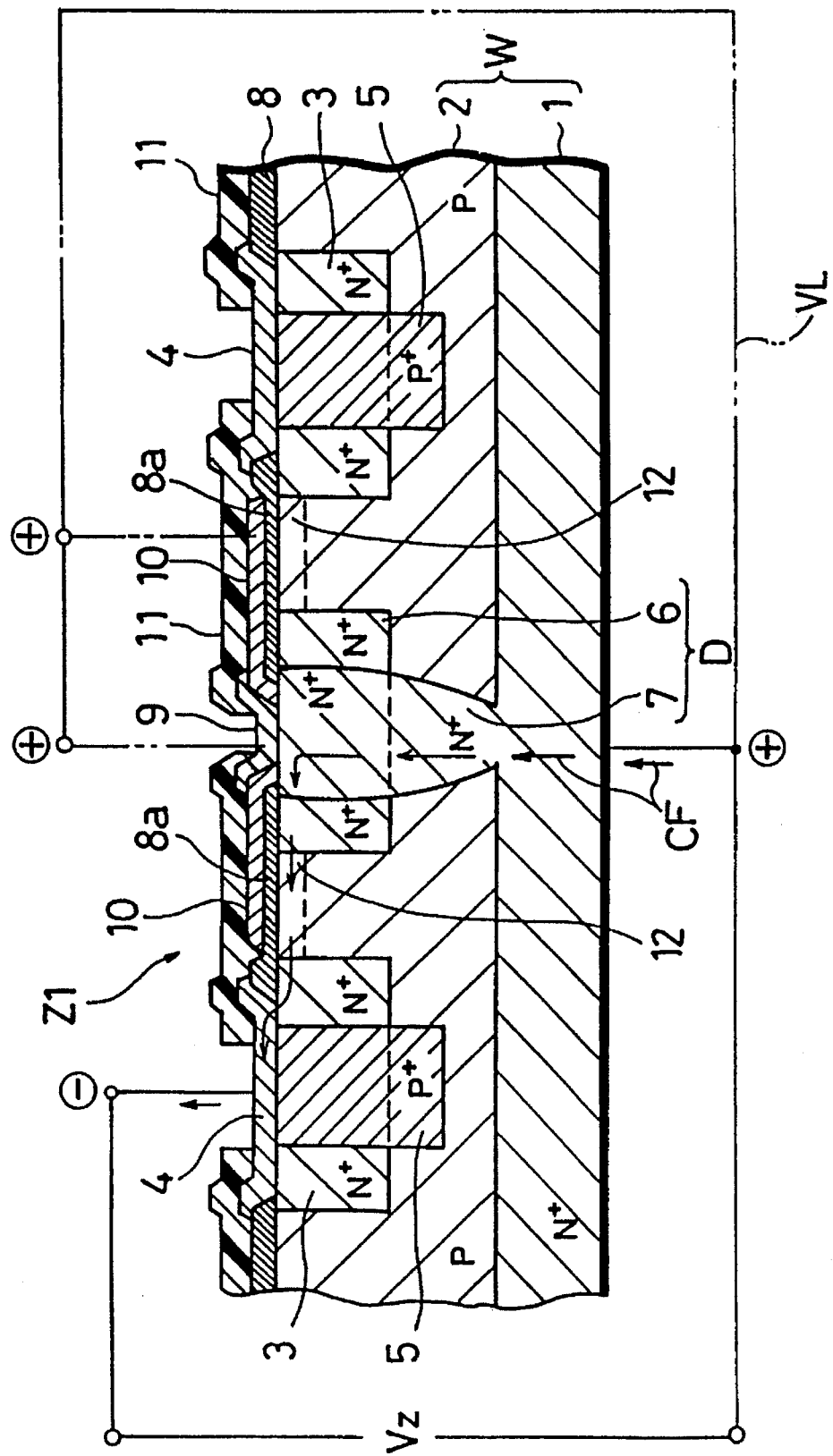
FIG. 1 is a sectional view of a voltage regulator diode according to a first embodiment of the invention.
Figure 2:
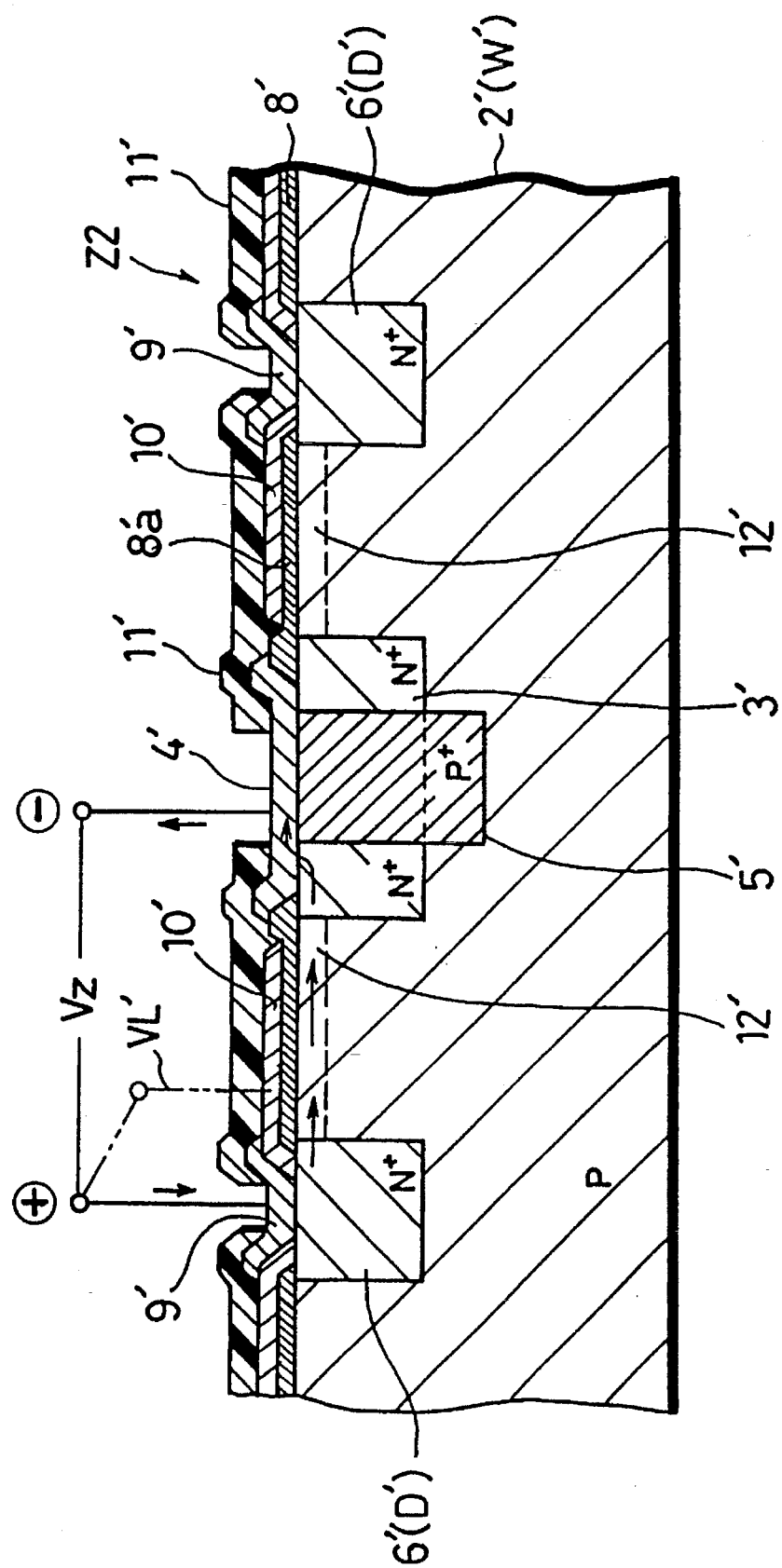
FIG. 2 is a sectional view of a voltage regulator diode according to the second embodiment of the invention.
Figure 3:
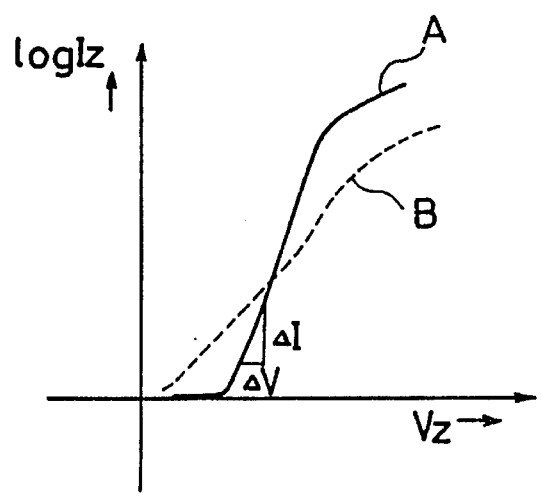
FIG. 3 is a graphical chart representing the voltage-current characteristics generated by the voltage regulator diode according to the invention.

Referring to FIGS. 1 through 3, preferred embodiments of the invention are described below.

FIG. 1 shows a voltage regulator diode Z1 according to a first embodiment of the invention. The diode Z1 comprises a semiconductor substrate W obtained by epitaxially forming a P-type impurity diffusion layer 2 on a highly doped N-type layer (N+ layer) 1.

A highly doped N-type source region (N+ source region) 3 is form in an annular arrangement within the P-type layer 2 of the semiconductor substrate W. The N+ source region 3 is held in contact with an annular source electrode 4 formed on the surface of the substrate W. The source electrode 4 is held in ohmic contact with the P-type layer 2 via a highly doped P-type region (P+ region) 5 extending into the P-type layer 2 of the substrate W through the source region 3. Because of this arrangement, the source electrode 4 is always held substantially at the same potential as the P-type layer 2.

Furthermore, a highly doped N-type drain region (N+ drain region) D is formed in the P-type layer 2 of the semiconductor substrate W substantially at the center of the annular source regions 3. According to the first embodiment shown in FIG. 1, the drain region D comprises a shallower first drain portion 6 and a deeper second drain portion 7 extending to the N+ layer 1 of the substrate W through the first drain portion 6. The reason for constituting the drain region D by the two portions 6 and 7 will be described later.

An insulating layer 8 is formed on the surface of the semiconductor substrate W. At a portion of the insulating layer 8 corresponding to the source region 8 is formed an opening where the source electrode 4 is formed. Likewise, at another portion of the insulating layer 8 corresponding to the drain region D is also formed an opening where the shorting electrode 9 is formed.

The insulating layer 8 includes a gate insulating portion 8a between the source region 8 and the drain region D. A gate electrode 10 is formed to cover the gate insulating portion 8a. According to the present invention, the gate electrode 10 is held in ohmic contact with the shorting electrode 9. In consequence, the gate electrode 10 is shorted to the drain region D via the shorting electrode 9 and thereby held substantially at the same potential as the drain region D. In the first embodiment, although the shorting electrode 9 is held in direct contact with the drain region D, it does not function as a drain electrode.

In the present invention, the source electrode 4 and the shorting electrode 9 may be preferably formed of aluminum, whereas the gate electrode 10 may be preferably formed of polycrystalline silicon doped with impurities. Further, the insulating layer 8 may be preferably made of silicon dioxide ($SiO_2$) for stabilizing its physical characteristics. However, the use of the above-mentioned materials is not essential, and other materials may also be used as well. Indicated by reference numeral 11 in FIG. 1 is a passivation film.

In use, the voltage regulator diode Z1 is bonded such that the N+ layer 1 of the substrate W is brought into contact with a pad-form drain electrode (not shown) formed on a circuit board for example. In this condition, a predetermined voltage Vz is applied between the source electrode 4 and the drain electrode (i.e., the N+ layer 1). In the first embodiment, the voltage Vz is applied so that the source electrode 4 becomes negative potential while the N+ layer 1 becomes positive.

As described previously, the second drain portion 7 of the N+ drain region D extends the N+ layer 1, whereas the gate electrode 10 is shorted to the N+ drain region D via the shorting electrode 9. Thus, the N+ layer 1 and the gate electrodes 10 are held substantially at the same potential through the drain region D and the shorting electrode 9, so that the voltage Vz between the source electrodes 4 and the N+ layer 1 can be considered as equivalent to the voltage (gate voltage) between the source electrode 4 and the gate electrode 10. Imaginery lines VL in FIG. 1 show that the shorting electrode 9 and the gate electrode 10 are subjected to the same potential as the N+ layer 1.

When the gate voltage Vz is thus applied, the field effect provided by the gate electrode held at the positive potential attracts electrons in the P-type layer 2 of the substrate W while repelling positive holes. However, as long as the gate voltage Vz is below a predetermined threshold value, the number of electrons attracted to the gate electrode 10 still remains small, so that the inherent resistance of the P-type layer 2 prevails to prevent current passage between the source region 3 and the drain region D due to non-conduction.

On the other hand, when the gate voltage Vz reaches the predetermined threshold value, the number of electrons attracted by the gate electrode 10 increases sufficiently to form a channel (N-channel) 12 right below the gate electrode 10. As a result, the source region 3 conducts with the drain region D via the N-channel 12, and as indicated by arrows CF in FIG. 1, current flows along a passagethrough the N+ layer 1, the drain region D, the N-channel 12, and the source region 3.

Once the N-channel 12 is formed, the gate voltage Vz fluctuates only little even if the current increases. This is because the N+ layer 1, N+ drain region D, N-channel 12, and N+ source region 3 contained in the current path are equally high in electron density to render the resistance of the current path extremely low. In consequence, the threshold voltage Vz can be held substantially constant, so that the voltage regulator diode Z1 according to the present invention can be used in place of a conventional Zener diode.

FIG. 3 is a graph showing that the voltage regulator diode Z1 according to the present invention is superior to a conventional Zener diode in terms of the voltage-current characteristics. The abscissa in FIG. 3 represents the gate voltage Vz, whereas the ordinate represents the current Iz in logarithm.

Figure 4:
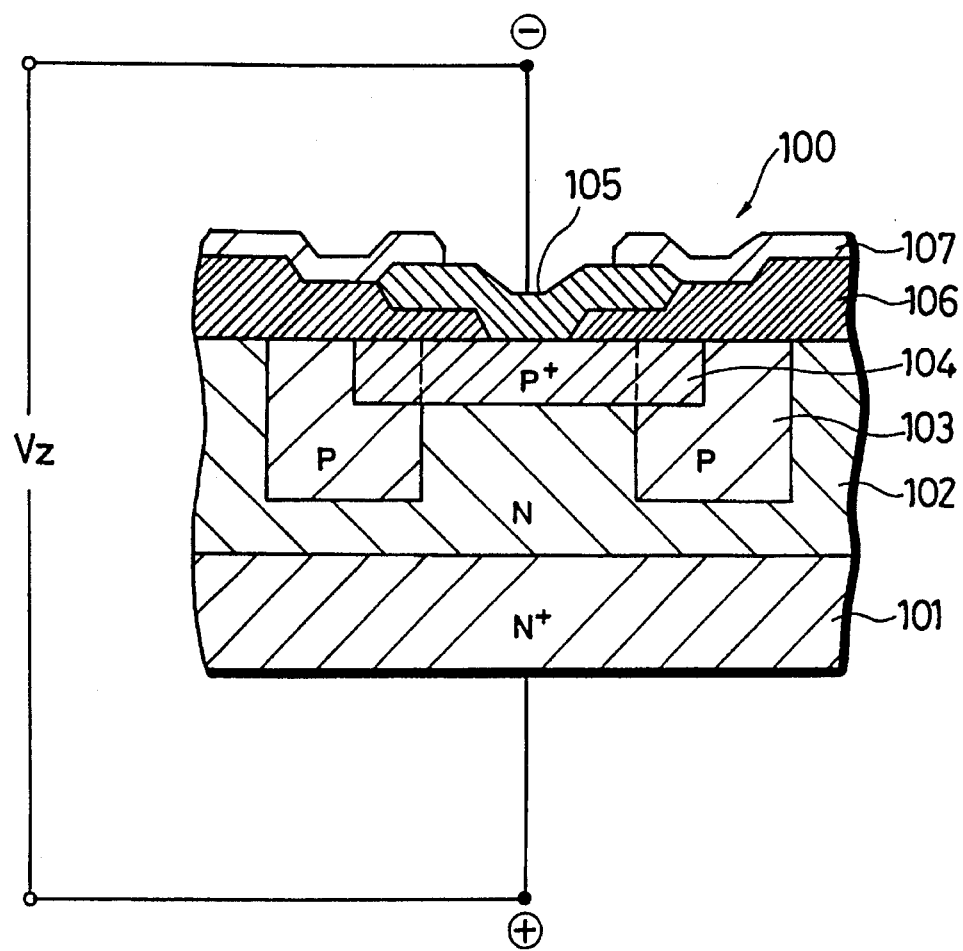
FIG. 4 is a sectional view showing a prior art voltage regulator diode.

The curve A shown in the graph of FIG. 3 designates the voltage-current characteristics of the inventive voltage regulator diode Z1, whereas the other curve B represents the voltage-current characteristics of a conventional Zener diode (see FIG. 4). It is evident from the graph that the inventive voltage regulator diode Z1 exhibits a sharp rise of the current close to the threshold value of the gate voltage Vz (curve A), showing superiority in the ability of holding a constant voltage in comparison with the conventional Zener diode (curve B). This difference is based on the fact that, after achieving a predetermined voltage, the inventive voltage regulator diode Z1 allows the current to flow through the N-channel 12 having an extremely low resistance, whereas the prior art Zener diode 100 (FIG. 4) makes the current to flow through the N-type layer 102 which still has a relatively high resistance.

In the inventive voltage regulator diode Z1, the threshold gate voltage value Vz (corresponding to the breakdown voltage of a conventional Zener diode) can properly be adjusted by varying any of the following three parameters (factors).

(1) Thickness of the gate insulating portion 8a
(2) Concentration of impurities (dopants) in the P-type layer 2
(3) Length of the N-channel 12

The thickness of the gate insulating portion 8a, which affects the the ability of the gate electrode 10 to attract electrons in the P-type layer 2, can be utilized for controlling the threshold gate voltage Vz.

Since thickness of the gate insulating portion 8a can easily and strictly be adjusted in the course of or after forming the insulating layer 8, this parameter can be utilized for conveniently adjusting the threshold gate voltage value Vz.

The concentration of the dopants (the above factor (2)) in the P-type layer 2 determines the ability of supplying electrons to the N-channel 12 and therefore can be utilized to control the threshold gate voltage Vz. Since this dopant concentration need not be set high, a counted number of dopants may be implanted without much increasing the production cost. Thus, the control of the threshold gate voltage Vz can be easily and strictly performed by adjusting this parameter.

The length of the N-channel 12 (the above factor (3)) is equal to the distance between the N+ source region 3 and the N+ drain region D. Therefore, by performing dopant diffusion simultaneously with respect to both the source region 8 and the first drain portion 6 of the drain region D, it is possible to easily and strictly control the length of the N-channel 12, i.e., the threshold gate voltage Vz.

Any of the above-mentioned parameters (1)–(3) has nothing to do with the dopant concentration in the source region 3 and the drain region D. This is because it is only the presence or absence of the channel 12 that it important for the operation of the inventive voltage reulator diode Z1, so that the source region 3 and the drain region D need only be doped at a high concentration (not super high concentration). Accordingly, the threshold gate voltage Vz can be easily controlled with a relatively high degree of freedom by conveninently adjusting any of the above parameters (1)–(3). Further, even when setting at a low voltage of 2–3 V, it is unnecessary to dope the source region 3 and the drain region D at a super high concentration (e.g. $10^{21}/cm^3$), so that the problem of leak current encountered in a conventional Zener diode can be avoided.

As already described, the N+ drain region D comprises the shallower first drain portion 6 and the deeper second drain portion 7 which extends through the first drain portion into contact with the N+ layer 1. The reason for such a structure for the N+ drain region D is closely related to the above-mentioned parameter (3), as described below.

For facilitating adjustment of the distance between the source region 3 and the drain region D, namely the length of the N-channel 12, it is necessary to perform dopant diffusion simultaneously with respect to both the source region 3 and the drain region D, and it is preferable that the dopant diffusion be relatively shallow. On the other hand, the source region 3 must not extend to the N+ layer 1, whereas the drain region D must extend to the N+ layer 1. Thus, the whole drain region D and the source region 3 cannot be formed simultaneously. In view of this, the drain region D is divided into the first drain portion 6 and the second drain portion 7, whereby the first drain portion 6 is formed simultaneously with the source region, and the second drain portion 7 is thereafter formed by a diffusion method having a high degree of dopant penetration.

FIG. 2 shows a voltage regulator diode Z2 according to second embodiment of the present invention. The voltage regulator diode Z2 comprises a semiconductor substrate W' solely consisting of a P-type impurity diffusion layer 2', thus being advantageously more economical than the first embodiment which utilizes the epitaxially formed substrate W.

A highly doped N-type source region (N+ source region) 3' is formed in the P-type layer 2' generally at the center of the substrate W'. The N+ source region 3' is held in contact with a source electrode 4' formed on the surface of the substrate W'. The source electrode 4' is held in ohmic contact with the P-type layer 2' via a highly doped P-type region (P+ region) 5' extending into the interior of the P-type layer 2' through the N+ source region 3'. Because of such an arrangement, the source electrode 4' is always held substantially at the same potential as the P-type layer 2'.

Further, a highly doped N-type drain regions (N+ drain region) D' is annularly formed in the P-type layer 2' around the center N+ source region 3'. In contrast to the first embodiment shown in FIG. 1, the N+ drain region D' solely comprises a relatively shallow drain portion 6'.

The reason for this is that the semiconductor substrate W' is devoid of an N+ layer.

An insulating layer 8' is formed on the surface of the semiconductor substrate W' (i.e., the P-type layer 2'). At a portion of the insulating layer 8' corresponding to the N+ source region 3' is formed an opening where the source electrode 4' is formed. At another portion of the insulating layer 8' corresponding to the N+ drain regions D' is also formed an opening where a shorting electrode 9' functioning also as a drain electrode is formed.

On the other hand, the insulating layer 8' has a gate insulating portion 8a' between the N+ source region 3' and the N+ drain region D', and a gate electrode 10' is formed to cover the gate insulating portion 8a'. According to the present invention, the gate electrode 10' is held in ohmic contact with the shorting electrode 9'. As a result, the gate electrode 10' is shorted to the N+ drain region D' via the shorting electrode 9', whereby these three parts are held substantially at an equal potential.

The materials for the source electrode 4', short-circuiting electrode 9', gate electrode 10' and insulating layer 8' of the second embodiment can be selected in the same manner as in the first embodiment. Reference numeral 11' in FIG. 2 designates a passivation film.

In operation, a predetermined voltage Vz is applied between the source electrode 4' and the shorting electrode 9' functioning as a drain electrode. The polarity of the voltage Vz is such that the source electrode 4' is negative, whereas the shorting electrodes 9' is positive.

As previously described, the gate electrode 10' is held in ohmic contact with the shorting electrode 9'. Therefore, the voltage Vz between the source electrode 4' and the shorting electrode 9' can be considered as equivalent to the voltage (gate voltage) between the source electrode 4' and the gate electrode 10'. An imaginery line VL' in FIG. 2 represents that the shorting electrode 9' and the gate electrode 10' are held at the same potential.

When the gate voltage Vz is thus applied, the field effect of the positively charged gate electrode 10' attracts electrons contained in the P-type layer 2' while repelling positive holes. Therefore, when the gate voltage Vz exceeds a predetermined threshold value, a channel (N-channel) 12' is formed right below the gate electrode 10'. Thus, the voltage regulator diode Z2 of the second embodiment has the same operation and advantages as that of the first embodiment. However, a difference from the first embodiment resides in that current passes only along the surface of the semiconductor substrate W'.

According to either of the embodiments described above, the N-channel 12 (or 12') is formed. However, a P-channel may be formed if the P-type elements are replaced by N-type elements while replacing the N-type elements by P-type elements. It should be understood that these modifications are included in the scope of the present invention.

INDUSTRIAL UTILITY

A voltage regulator diode according to the present invention can be incorporated in a standard voltage generating circuit or a voltage stabilizing circuit as a substitute for a conventional Zener diode. In particular, it is expected that the inventive voltage regulator diode is useful where a low rated voltage of 2–3 V is required.

We claim:

1. A voltage regulator diode comprising: a semiconductor substrate including at least a head side semiconductor layer of a first type; a source region formed in the head side semiconductor layer to adjoin a surface thereof and highly doped to be of a second type opposite to the first type; a highly doped drain region of the second type formed in the head side semiconductor layer to adjoin said surface; a source electrode held in contact with the source region; a shorting electrode held in contact with the drain region; a gate insulating portion formed between the source region and the drain region to partly cover said surface of the head side semiconductor layer; and a gate electrode formed to cover the gate insulating portion; wherein the gate electrode is shorted to the drain region through the shorting electrode, whereby a channel is partially formed in the head side semiconductor layer to establish conduction between the source region and the drain region when a gate voltage not less than a predetermined threshold value is applied, wherein the substrate comprises a highly doped tail side semiconductor layer of the second type in addition to the head side semiconductor layer of the first type, the drain region extending to the tail side semiconductor layer through the head side semiconductor layer.

2. The voltage regulator diode according to claim 1, wherein the drain region comprises a shallower first drain portion, and a deeper second drain portion extending to the tail side semiconductor layer through the first drain portion.

3. The voltage regulator diode according to claim 1, wherein the gate insulating portion is made of silicon dioxide.

4. The voltage regulator diode according to claim 1, wherein the gate electrode is made of polycrystalline silicon.

5. The voltage regulator diode according to claim 1, wherein the source electrode and the shorting electrode are made of aluminum.

\* \* \* \* \*